United States Patent
Ma et al.

(10) Patent No.: US 11,695,138 B2
(45) Date of Patent: Jul. 4, 2023

(54) DEVICE AND METHOD FOR ONLINE IMPEDANCE SPECTRUM MEASUREMENT OF VEHICLE-MOUNTED HYDROGEN FUEL CELL

(71) Applicant: Tongji University, Shanghai (CN)

(72) Inventors: Tiancai Ma, Shanghai (CN); Jiajun Kang, Shanghai (CN); Weikang Lin, Shanghai (CN); Zhaoli Zhang, Shanghai (CN); Kaihang Song, Shanghai (CN)

(73) Assignee: TONGJI UNIVERSITY, Shanghai (CN)

( * ) Notice: Subject to any disclaimer, the term of this patent is extended or adjusted under 35 U.S.C. 154(b) by 9 days.

(21) Appl. No.: 17/454,327

(22) Filed: Nov. 10, 2021

(65) Prior Publication Data

US 2022/0149400 A1 May 12, 2022

(30) Foreign Application Priority Data

Nov. 11, 2020 (CN) .......................... 202011252065.7

(51) Int. Cl.
*H01M 8/04537* (2016.01)
*G01R 31/3842* (2019.01)
(Continued)

(52) U.S. Cl.
CPC ... *H01M 8/04641* (2013.01); *H01M 8/04552* (2013.01); *H01M 8/04582* (2013.01);
(Continued)

(58) Field of Classification Search
CPC ......... H01M 8/04641; H01M 8/04552; H01M 8/04582; H01M 8/04544; H01M 8/04559; H01M 8/04574; H01M 8/04589; H01M 8/04604; H01M 8/04611; H01M 8/04619; H01M 8/04634; H01M 8/04649; H01M 2250/20; G01R 31/389; G01R 31/378; G01R 31/3842; G01R 31/392
See application file for complete search history.

(56) References Cited

U.S. PATENT DOCUMENTS

| | | | | |
|---|---|---|---|---|
| 2002/0196025 A1* | 12/2002 | Freeman | ............ | G01R 31/3648 324/426 |
| 2005/0110464 A1* | 5/2005 | Baker | ............... | H01M 8/04552 320/134 |

* cited by examiner

*Primary Examiner* — Matthew W Van Oudenaren
(74) *Attorney, Agent, or Firm* — Mark T. Vogelbacker; Eckert Seamans Cherin & Mellott, LLC

(57) ABSTRACT

An online impedance spectrum measuring device and method for a vehicle-mounted hydrogen fuel cell includes: a controllable alternating current source, configured to apply a sinusoidal alternating signal; a cell voltage signal preceding-stage measuring circuit, configured to select to communicate with one monocell via a voltage signal gating circuit; a current sensor and a cell current signal preceding-stage measuring circuit connected with the current sensor; and a signal conditioning and amplifying circuit, a multi-channel simultaneous sampling analog-digital conversion circuit, a digital signal processor and an upper computer, which are connected in sequence, wherein the signal conditioning and amplifying circuit is connected to the cell voltage signal preceding-stage measuring circuit and the cell current signal preceding-stage measuring circuit, separately; and the upper computer is connected with the controllable alternating source and the voltage signal gating circuit.

11 Claims, 2 Drawing Sheets

(51) Int. Cl.
*G01R 31/389* (2019.01)
*G01R 31/378* (2019.01)
*H01M 8/04791* (2016.01)

(52) U.S. Cl.
CPC .......... *G01R 31/378* (2019.01); *G01R 31/389* (2019.01); *G01R 31/3842* (2019.01); *H01M 8/0482* (2013.01); *H01M 8/04559* (2013.01); *H01M 8/04589* (2013.01); *H01M 8/04649* (2013.01); *H01M 2250/20* (2013.01)

DEVICE AND METHOD FOR ONLINE IMPEDANCE SPECTRUM MEASUREMENT OF VEHICLE-MOUNTED HYDROGEN FUEL CELL

CROSS REFERENCE TO RELATED APPLICATION(S)

This patent application claims the benefit and priority of Chinese Patent Application No. 202011252065.7 filed on Nov. 11, 2020, the disclosure of which is incorporated by reference herein in its entirety as part of the present application.

TECHNICAL FIELD

The present disclosure relates to the field of online impedance measurement of hydrogen fuel cells, and in particular to a device and method for online impedance spectrum measurement of a vehicle-mounted hydrogen fuel cell.

BACKGROUND ART

As energy crisis and environmental protection issues have attracted the attention of all sectors of society, clean energy and renewable energy technologies are deeply researched and widely used. Due to the advantages of high energy density, high efficiency and pollution-free discharge, a proton exchange membrane fuel cell is considered to have the potential of replacing an internal combustion engine and being massively used for new energy automobiles in the future. However, there are lots of problems currently restricting its wide use in the automotive field, especially the durability and lifetime. As a complex electrochemical system, a fuel cell system has multiple operation control variables which are mutually coupled, and under improper operation or insufficient management, the fuel cell is easy to generate faults such as flooding, dry film and gas starvation, resulting in performance degradation and service life shortening. A fuel cell for vehicles has severe operation conditions and complex and variable working conditions, which makes the problem even worse. To prolong the service life of the fuel cell as much as possible, a cell state detecting module is generally installed in the fuel cell system to monitor the operation state of the fuel cell in real time and diagnose its state according to a measuring result, so as to control the operation condition and avoid faults. However, the fuel cell is relatively complex in structure and is difficult to directly install a sensor in the cell to directly detect operation indexes in the system.

To indirectly detect the health status of the fuel cell, a voltage and an impedance are generally measured to analyze and evaluate its operation states. In particular, an electrochemical impedance spectroscopy technology can reflect its internal state in an impedance spectroscopy manner and then describe and fit its overall characteristics according to the analysis of impedance spectrum data, thereby gaining high attention in the industry. In a laboratory environment, impedance spectrum data in a full-band (0.001 Hz-100 kHz) range can be acquired by an electrochemical workstation or other dedicated impedance measuring devices. However, in a vehicle-mounted environment, the dedicated impedance measuring devices have the defects of large size, easiness in damage and long measurement period, and are not suitable for detecting a fuel cell system for vehicles in real time. In addition, the fuel cell for vehicles is mostly formed by connecting a plurality of fuel cell monomers in series, and instruments such as the electrochemical workstation and the like are mostly designed for impedance measurement of a single fuel cell and do not meet the actual measuring requirements of the fuel cell system.

SUMMARY

An objective of the present disclosure is to provide a device and method for online impedance spectrum measurement of a vehicle-mounted hydrogen fuel cell, and to miniaturize impedance spectrum measuring devices for fuel cells and improve their reliability by a designed current signal preceding-stage measuring circuit, a designed voltage signal gating circuit and a semiconductor component.

The above objective of the present disclosure can be achieved by the following technical solutions.

A device for online impedance spectrum measurement of a vehicle-mounted hydrogen fuel cell, includes:

a controllable alternating current source, connected to two ends of the fuel cell and configured to apply a sinusoidal alternating signal;

a cell voltage signal preceding-stage measuring circuit, connected, by the voltage signal gating circuit, to two ends of each monocell of the fuel cell, and configured to select, by the voltage signal gating circuit, to communicate with one monocell;

a current sensor and a cell current signal preceding-stage measuring circuit connected with the current sensor, wherein the current sensor is connected to an output DC bus of the fuel cell and configured to measure outuput DC bus current of the fuel cell; and a signal conditioning and amplifying circuit, a multi-channel simultaneous sampling analog-digital conversion circuit, a digital signal processor and an upper computer, which are connected in sequence, wherein the signal conditioning and amplifying circuit is connected to the cell voltage signal preceding-stage measuring circuit and the cell current signal preceding-stage measuring circuit, separately; and the upper computer is connected with the controllable alternating current source and the voltage signal gating circuit.

The device may further include a load which is connected with two ends of the fuel cell.

The load may be an electronic load.

The upper computer may be a computer.

A measuring method applied to the device for online impedance spectrum measurement of a vehicle-mounted hydrogen fuel cell, includes:

step S1, generating, by the controllable alternating current source, the sinusoidal alternating signal with a specified frequency and applying the sinusoidal alternating signal on two ends of the fuel cell;

step S2, selecting a to-be-measured monocell;

step S3, measuring a voltage signal and a current signal at the same time by the cell voltage signal preceding-stage measuring circuit and the cell current signal preceding-stage measuring circuit, respectively, storing filtered data in a memory, and executing step S4 until a preset sampling upper limit is reached;

step S4, converting data, in the time domain, of the voltage signal and the current signal into data in the frequency domain, respectively, and acquiring a conversion result of a corresponding frequency from calculation results of the voltage signal and the current signal according to the specified frequency, wherein the conversion result includes a signal amplitude and a phase angle at the frequency;

step S5, calculating an actual current amplitude, and acquiring an impedance modulus according to a ratio of the voltage signal to the actual current amplitude;

step S6, calculating a difference between a phase angle of the voltage signal and a phase angle of the current signal so as to acquire a phase angle of an impedance;

step S7, calculating an impedance real part and an impedance imaginary part according to the impedance modulus and the phase angle; and step S8, determining whether there is a to-be-measured monocell, if there is the to-be-measured monocell, returning to step S2, and if there is no to-be-measured monocell, finishing the measuring task.

In step S4, fast Fourier transform and cross-correlation operation may be used to convert the data, in the time domain, of the voltage signal and the current signal into the data in the frequency domain.

Step S7 may specifically include:

step S71, calculating the impedance real part according to the impedance modulus and the phase angle; and step S72, substituting the acquired impedance real part into an impedance modulus definition to acquire the impedance imaginary part.

In step S5, the process of calculating the actual current amplitude may specifically include: calculating the actual current amplitude based on an acquired current sensor signal amplitude according to a relationship between a pre-configured current sensor signal amplitude and an actual current.

A low-pass filter may be adopted for the filtering process in step S3.

The frequency of the sinusoidal alternating signal is in a range of 1-1000 Hz.

Compared with the prior art, the present disclosure has the following beneficial effects:

1) miniaturizing impedance spectrum measuring devices for fuel cells and improving their reliability by the cell current signal preceding-stage measuring circuit, the voltage signal gating circuit and the semiconductor component;

2) achieving the polling of cell monomers of a fuel cell for vehicles;

3) correctly and rapidly calculating the impedance real part and the impedance imaginary part by a designed impedance spectrum calculating method; and 4) acquiring, by the upper computer, the real-time state of the fuel cell, and accurately acquiring the impedance of the fuel cell to carry out early warning on faults, so as to improve the control accuracy, operation condition and reliability of the fuel cell, and prolong its overall service life.

Numeral references: 1 represents a fuel cell, 2 represents a controllable alternating current source, 3 represents a load, 4 represents a current sensor, 5 represents a cell current signal preceding-stage measuring circuit, 6 represents a cell voltage signal preceding-stage measuring circuit, 7 represents a voltage signal gating circuit, 8 represents a signal conditioning and amplifying circuit, 9 represents a multipath independent synchronous analog-digital conversion circuit, and 10 represents a digital signal processor.

DETAILED DESCRIPTION OF THE EMBODIMENTS

The present disclosure is now described in detail in conjunction with the accompanying drawings and a specific embodiment. The embodiment is implemented on the premise of the technical solutions of the present disclosure, and presents detailed implementation and specific operation process. The protection scope of the present disclosure, however, is not limited to the following embodiment.

Figure 1:
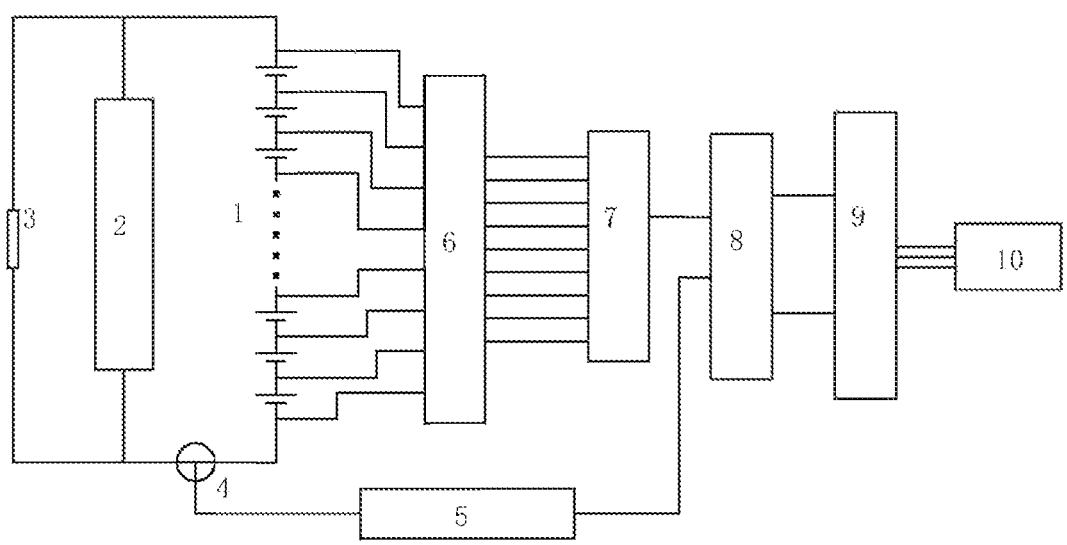
FIG. 1 is a structural diagram according to the present disclosure.
Figure 2:
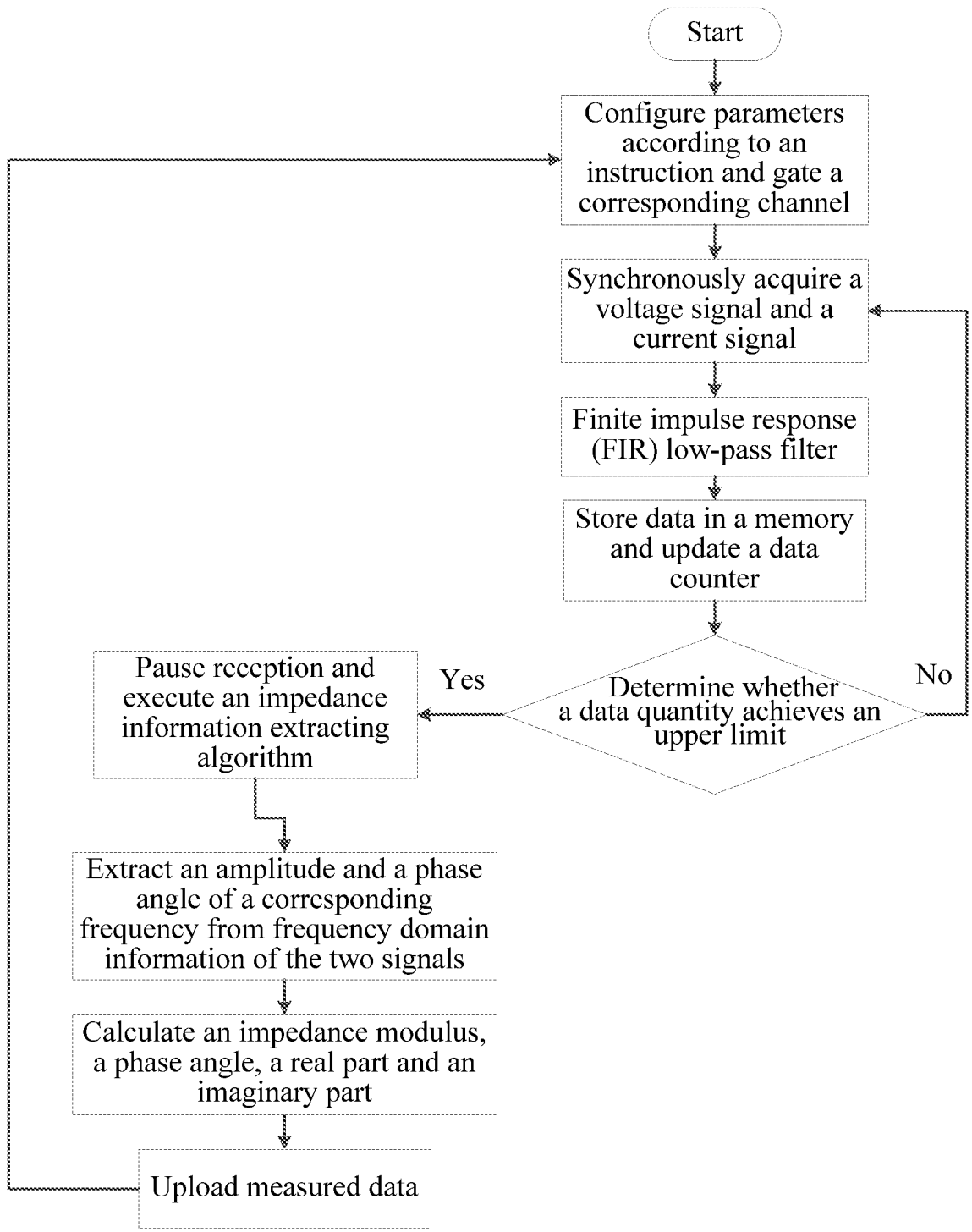
FIG. 2 is a flow diagram of a major part of the measuring process according to the present disclosure.

A device for online impedance spectrum measurement of a vehicle-mounted hydrogen fuel cell 1, as shown in FIG. 1, may include the components as described below.

A controllable alternating current source 2 is connected to two ends of the fuel cell 1 and is configured to apply a sinusoidal alternating signal, for example, a current controllable direct current-direct current (DC-DC) converter.

A cell voltage signal preceding-stage measuring circuit 6 is connected to two ends of each monocell of the fuel cell 1 via a voltage signal gating circuit 7, and is configured to select, by the voltage signal gating circuit 7, to communicate with one monocell.

A current sensor 4 and a cell current signal preceding-stage measuring circuit 5 connected with the current sensor 4 are included. The current sensor 4 is connected to an output DC bus of the fuel cell 1 and is configured to measure a output DC bus current of the fuel cell 1.

A signal conditioning and amplifying circuit 8, a multi-channel simultaneous sampling analog-digital conversion circuit 9, a digital signal processor 10 and an upper computer are connected in sequence. The signal conditioning and amplifying circuit 8 is connected to the cell voltage signal preceding-stage measuring circuit 6 and the cell current signal preceding-stage measuring circuit 5, separately, and the upper computer is connected with the controllable alternating current source 2 and the voltage signal gating circuit 7.

The device may further include a load 3 which is connected with two ends of the fuel cell 1. In the present embodiment, the load 3 may be an electronic load 3, a power resistor or any other electric appliance with a rated power lower than an output power of the fuel cell 1. The upper computer may be a computer.

In the embodiment, the cell voltage preceding-stage measuring circuit may adopt AD8479, the voltage signal gating circuit 7 may adopt TMUX1108, the signal conditioning and amplifying circuit 8 may adopt PGA281, the multipath independent synchronous analog-digital conversion circuit 9 may adopt ADS131A02, and the digital signal processor 10 may adopt TMS320F28377D.

In addition, an electric isolation design may be provided for an interface between the voltage signal gating circuit 7 and the fuel cell 1, such that any part of a stack of the fuel cell can be connected for measurement, namely, free matching and combination are allowed. All the cells in the stack can be measured at the same time by integrating multiple modules into a small controller shell. Moreover, owing to compactness and convenient arrangement, the volume of a fuel cell system can be reduced.

The cell voltage signal preceding-stage measuring circuit 6 may be connected to an output end of each cell monomer of the fuel cell 1 according to a cell arranging sequence, and may be configured to measure monomer voltage signals of the fuel cell 1. The cell current signal preceding-stage measuring circuit 5 may be connected to a corresponding signal output end of the current sensor 4, and may be configured to measure a total output current signal of the fuel cell 1. The voltage signal gating circuit 7 may be configured to select a corresponding to-be-measured monomer voltage signal of the fuel cell 1. The signal conditioning and amplifying circuit 8 may be configured to condition and amplify a cell voltage signal and a cell current signal. The multi-channel simultaneous sampling analog-digital conversion circuit may be configured to convert the cell voltage signal and the cell current signal from analog signal to digital signal, and the digital signal processor 10 may be tasked with execution of a control process of the device for impedance spectrum measurement as well as processing of the digitalized cell voltage signal and cell current signal.

The external controllable alternating current source 2, the electronic load 3 or the current controllable DC-DC converter may be used for applying a sinusoidal alternating current excitation with determined frequency and amplitude on the fuel cell 1. The cell voltage signal measured by the cell voltage signal preceding-stage measuring circuit 6 is subjected to the voltage signal gating circuit 7 for output of the selected cell voltage signal, and may then be processed together with the cell current signal measured by the cell current signal preceding-stage measuring circuit 5 by the signal conditioning and amplifying circuit 8. The processed cell voltage signal and cell current signal may be converted into digital signals by the multi-channel simultaneous sampling analog-digital conversion circuit and uploaded into the digital signal processor 10 via a high-speed bus. The operations such as signal uploading, impedance spectrum information calculation or abnormal fluctuation capture may be carried out according to different working modes after data filtering and storage.

The digital signal processor 10 may control the voltage signal gating circuit 7 to access a corresponding monomer voltage signal of the fuel cell 1 according to an automatic polling logic or a number specified by the upper computer, adjust an amplifier gain of the signal conditioning and amplifying circuit 8 according to a measurement result of the multi-channel simultaneous sampling analog-digital conversion circuit such that the output voltage of the signal conditioning and amplifying circuit 8 is in a normal working range of the analog-digital conversion circuit, detect parameters of an onboard peripheral or an external sensor at regular intervals to carry out module self-inspection, and communicate with the upper computer to acquire system information, update parameters of a measurement target and upload a system status and data of an impedance spectrum measuring module.

The device for impedance spectrum measurement may measure, with a certain sampling frequency, a voltage signal and a current signal of the fuel cell 1 according to an instruction of the upper computer and a frequency and an amplitude of a sinusoidal alternating current applied on the fuel cell 1, carry out low-pass filtering on the voltage signal and the current signal, store the voltage signal and the current signal in a processor memory, acquire impedance spectrum information such as an impedance modulus and a phase angle, at a specified frequency point, of a proton exchange membrane fuel cell 1 by algorithms (specified by the upper computer, or selected by the device for impedance spectrum measurement) such as fast Fourier transform and digital lock-in amplifier cross-correlation operation after a sampling upper limit is achieved, and upload the impedance spectrum information into the upper computer. Therefore, the device for impedance spectrum measurement can be used for online self-inspection and health status estimation under a stable working condition of the fuel cell 1.

The device for impedance spectrum measurement may measure, with the certain sampling frequency, the voltage signal and the current signal of the fuel cell 1 according to the instruction of the upper computer and the operation condition of the fuel cell 1, store the voltage signal and the current signal in the processor memory, carry out low-pass filtering on the voltage signal and the current signal, carry out algorithms such as discrete wavelet transform analysis or short term fast Fourier transform on the voltage signal and the current signal of the fuel cell 1, capture high-frequency abnormal variations in a cell response signal in each time slice in real time, and upload the high-frequency abnormal variations into the upper computer to carry out further fault diagnosis or control strategy adjustment. Therefore, the device for impedance spectrum measurement can be used for rapid real-time fault capture under a complex working condition of the fuel cell 1.

A measuring method applied to the device for online impedance spectrum measurement of a vehicle-mounted hydrogen fuel cell 1, includes the steps as follows.

In step S1, the sinusoidal alternating signal with the specified frequency is generated by the controllable alternating current source 2, and the sinusoidal alternating signal is applied on two ends of the fuel cell 1, where the frequency of the sinusoidal alternating signal is in the range of 1-1000 Hz.

In step S2, a to-be-measured monocell is selected.

In step S3, the voltage signal and the current signal are measured at the same time by the cell voltage signal preceding-stage measuring circuit 6 and the cell current signal preceding-stage measuring circuit 5, respectively, store data filtered by a low-pass filter in a memory, and execute step S4 after a preset sampling upper limit is achieved.

The voltage signal and the current signal are processed by the signal conditioning and amplifying circuit 8, and then input into the multi-channel simultaneous sampling analog-digital conversion circuit to be converted into digital signals from analog signals.

In step S4, data, in the time domain, of the voltage signal and the current signal is converted into data in the frequency domain, by adoption of fast Fourier transform and cross-correlation operation, separately, and a conversion result of a corresponding frequency is acquired from calculation results of the voltage signal and the current signal according to the specified frequency, wherein the conversion result includes a signal amplitude and a phase angle under the frequency.

In step S5, an amplitude of the impedance modulus being equal to an amplitude of the voltage signal divided by an amplitude of the current signal according to Ohm's law, so firstly an actual current amplitude is calculated according to a relationship between a signal amplitude of the current sensor 4 and an actual current, and then the impedance modulus is acquired according to a ratio of the voltage signal to the actual current amplitude.

In step S6, a difference between a phase angle of the voltage signal and a phase angle of the current signal is calculated so as to acquire a phase angle of an impedance.

In step S7, impedance real part and an impedance imaginary part are calculated according to the impedance modulus and the phase angle, specifically including:

In step S71, the impedance real part is calculated according to the impedance modulus and the phase angle; and In step S72, the acquired impedance real part is substituted into an impedance modulus definition to acquire the impedance imaginary part; and In step S8, determine whether there is a to-be-measured monocells, if there is a to-be-measured monocell, return to step S2, and if there is no to-be-measured monocell, the measuring task is finished.

In addition, the measuring method can provide abnormal fluctuation capture for the cell, specifically including:

timely acquire, calculate and average, by the impedance spectrum measuring device, impedance data of the fuel cell 1 under numerous preset frequencies according to the above measuring method and calculating method, and store the data in the processor memory; and continuously track, by the impedance spectrum measuring device, the data in a certain time, and calculate deviation values between the data measured at different time.

The capture for the abnormal fluctuations of the fuel cell 1 may include two types:

first, when parameters such as the impedance modulus and the phase angle in a certain measuring result obviously deviate from a normal range (the range is summarized and extracted by a large number of experimental data and pre-stored in the processor), repeat the acquiring process, and upload the data to the upper computer and send a corresponding warning after determining that a measuring error is not caused accidentally;

and second, when a deviation value of the data, in a certain time, measured by the impedance spectrum measuring device is obviously larger than a preset normal range, repeat the acquiring process, and upload the data to the upper computer and send a corresponding warning after determining that a measuring error is not caused accidentally.

What is claimed is:

1. A device for online impedance spectrum measurement of a vehicle-mounted hydrogen fuel cell, comprising:
    a controllable alternating current source, connected to two ends of the fuel cell and configured to apply a sinusoidal alternating signal; wherein the fuel cell comprises a plurality of monocells;
    a cell voltage signal preceding-stage measuring circuit, connected to two ends of each monocell of the fuel cell via a voltage signal gating circuit, and configured to select, by the voltage signal gating circuit, to communicate with one monocell;
    a current sensor and a cell current signal preceding-stage measuring circuit connected with the current sensor, wherein the current sensor is connected to an output DC bus of the fuel cell and configured to measure an output DC bus current of the fuel cell; and
    a signal conditioning and amplifying circuit, a multi-channel simultaneous sampling analog-digital conversion circuit, a digital signal processor and an upper computer, which are connected in sequence, wherein the signal conditioning and amplifying circuit is connected to the cell voltage signal preceding-stage measuring circuit and the cell current signal preceding-stage measuring circuit, separately; and the upper computer is connected with the controllable alternating current source and the voltage signal gating circuit.

2. The device for online impedance spectrum measurement of a vehicle-mounted hydrogen fuel cell according to claim 1, further comprising a load which is connected with two ends of the fuel cell.

3. The device for online impedance spectrum measurement of a vehicle-mounted hydrogen fuel cell according to claim 2, wherein the load is an electronic load.

4. A measuring method applied to the device for online impedance spectrum measurement of a vehicle-mounted hydrogen fuel cell according to claim 1, comprising the following steps:
    step S1, generating, by the controllable alternating current source, the sinusoidal alternating signal with a specified frequency and applying the sinusoidal alternating signal on two ends of the fuel cell;
    step S2, selecting a to-be-measured monocell;
    step S3, measuring a voltage signal and a current signal at the same time by the cell voltage signal preceding-stage measuring circuit and the cell current signal preceding-stage measuring circuit, respectively, filtering and storing data in a memory, and repeating the measuring, the filtering and the storing until a preset sampling upper limit is reached;
    step S4, converting data, in a time domain, of the voltage signal and the current signal into data in a frequency domain, respectively, and acquiring a conversion result of a corresponding frequency from calculation results of the voltage signal and the current signal according to the specified frequency, wherein the conversion result comprises a signal amplitude and a phase angle at the specified frequency;
    step S5, calculating an actual current amplitude and acquiring an impedance modulus according to a ratio of the voltage signal to the actual current amplitude;
    step S6, calculating a difference between a phase angle of the voltage signal and a phase angle of the current signal so as to acquire an impedance phase angle;
    step S7, calculating an impedance real part and an impedance imaginary part according to the impedance modulus and the impedance phase angle; and
    step S8, determining whether there is a to-be-measured monocell, if there is a to-be-measured monocell, returning to step S2, and if there is not a to-be-measured monocell, finishing a measuring task.

5. The measuring method according to claim 4, wherein in step S4, fast Fourier transform and cross-correlation operation are used to convert the data, in the time domain, of the voltage signal and the current signal into the data in the frequency domain.

6. The measuring method according to claim 4, wherein step S7 specifically comprises the following steps:
    step S71, calculating the impedance real part according to the impedance modulus and the impedance phase angle; and
    step S72, substituting the impedance real part into an impedance modulus definition to acquire the impedance imaginary part.

7. The measuring method according to claim 4, wherein in step S5, the calculating an actual current amplitude specifically comprises: calculating the actual current amplitude based on an acquired current sensor signal amplitude according to a relationship between a pre-configured current sensor signal amplitude and an actual current.

8. The measuring method according to claim 4, wherein a low-pass filter is adopted for the filtering in step S3.

9. The measuring method according to claim 4, wherein the specified frequency of the sinusoidal alternating signal is in a range of 1-1000 Hz.

10. A measuring method applied to the device for online impedance spectrum measurement of a vehicle-mounted hydrogen fuel cell according to claim 2, comprising the following steps:
    step S1, generating, by the controllable alternating current source, the sinusoidal alternating signal with a specified frequency and applying the sinusoidal alternating signal on two ends of the fuel cell;
    step S2, selecting a to-be-measured monocell;
    step S3, measuring a voltage signal and a current signal at the same time by the cell voltage signal preceding-stage measuring circuit and the cell current signal preceding-stage measuring circuit, respectively, filtering and storing data in a memory, and repeating the measuring, the filtering and the storing until a preset sampling upper limit is reached;

step S4, converting data, in a time domain, of the voltage signal and the current signal into data in a frequency domain, respectively, and acquiring a conversion result of a corresponding frequency from calculation results of the voltage signal and the current signal according to the specified frequency, wherein the conversion result comprises a signal amplitude and a phase angle at the specified frequency;

step S5, calculating an actual current amplitude and acquiring an impedance modulus according to a ratio of the voltage signal to the actual current amplitude;

step S6, calculating a difference between a phase angle of the voltage signal and a phase angle of the current signal so as to acquire an impedance phase angle;

step S7, calculating an impedance real part and an impedance imaginary part according to the impedance modulus and the impedance phase angle; and step S8, determining whether there is a to-be-measured monocell, if there is a to-be-measured monocell, returning to step S2, and if there is not a to-be-measured monocell, finishing a measuring task.

11. A measuring method applied to the device for online impedance spectrum measurement of a vehicle-mounted hydrogen fuel cell according to claim 3, comprising the following steps:

step S1, generating, by the controllable alternating current source, the sinusoidal alternating signal with a specified frequency and applying the sinusoidal alternating signal on two ends of the fuel cell;

step S2, selecting a to-be-measured monocell;

step S3, measuring a voltage signal and a current signal at the same time by the cell voltage signal preceding-stage measuring circuit and the cell current signal preceding-stage measuring circuit, respectively, filtering and storing data in a memory, and repeating the measuring, the filtering and the storing until a preset sampling upper limit is reached;

step S4, converting data, in a time domain, of the voltage signal and the current signal into data in a frequency domain, respectively, and acquiring a conversion result of a corresponding frequency from calculation results of the voltage signal and the current signal according to the specified frequency, wherein the conversion result comprises a signal amplitude and a phase angle at the specified frequency;

step S5, calculating an actual current amplitude and acquiring an impedance modulus according to a ratio of the voltage signal to the actual current amplitude;

step S6, calculating a difference between a phase angle of the voltage signal and a phase angle of the current signal so as to acquire an impedance phase angle;

step S7, calculating an impedance real part and an impedance imaginary part according to the impedance modulus and the impedance phase angle; and step S8, determining whether there is a to-be-measured monocell, if there is a to-be-measured monocell, returning to step S2, and if there is not a to-be-measured monocell, finishing a measuring task.

\* \* \* \* \*